US008096263B2

(12) United States Patent
Shim et al.

(10) Patent No.: US 8,096,263 B2
(45) Date of Patent: Jan. 17, 2012

(54) NANOPARTICLES, CONDUCTIVE INK AND CIRCUIT LINE FORMING DEVICE (75) Inventors: In-Keun Shim, Seoul (KR); Jae-Woo Joung, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 12/801,947

(22) Filed: Jul. 2, 2010

(65) Prior Publication Data
US 2010/0271432 A1    Oct. 28, 2010

Related U.S. Application Data (62) Division of application No. 11/508,312, filed on Aug. 23, 2006, now Pat. No. 7,771,624.

(30) Foreign Application Priority Data

Aug. 29, 2005 (KR) .................. 10-2005-0079382

(51) Int. Cl.
*B05B 5/025* (2006.01)
*B05C 5/00* (2006.01)

(52) U.S. Cl. ...................... 118/623; 118/621

(58) Field of Classification Search .......... 118/620–640, 118/313–315, 300; 252/512, 513, 514; 427/466, 427/64, 162; 428/403; 977/775; 347/20, 347/53, 55, 76
See application file for complete search history.

(56) References Cited

U.S. PATENT DOCUMENTS

| 5,882,802 | A * | 3/1999 | Ostolski ........................ 428/570 |
| 6,951,666 | B2 * | 10/2005 | Kodas et al. ............... 427/376.6 |
| 7,175,912 | B2 | 2/2007 | Cui et al. |
| 7,556,863 | B2 | 7/2009 | Berning et al. |
| 2003/0203207 | A1 | 10/2003 | Pessey et al. |
| 2004/0234901 | A1 * | 11/2004 | Lee ................................ 430/321 |
| 2006/0141149 | A1 | 6/2006 | Chen et al. |
| 2006/0228551 | A1 | 10/2006 | Chen et al. |

FOREIGN PATENT DOCUMENTS

| JP | 200-164531 | 6/2000 |
| JP | 2002/270417 | 9/2002 |
| JP | 2004-319435 | 11/2004 |
| JP | 2005-206871 | 8/2005 |

OTHER PUBLICATIONS

O'Conner, et al. "Magnetic properties of $FePT_x/Au$ and $CoPt_x/AU$ core-shell nanoparticles", Journal of Magnetism and Magnetic Materials, 226-230 (2001), pp. 1915-1917.
Lu et al. "Magnetic Switch of Permeability for Polyelectrolyte Microcapsules Embedded with CO@AU Nanoparticles", Langmuir 2005, 21, 2042-2050.

(Continued)

*Primary Examiner* — Yewebdar Tadesse (57) ABSTRACT

A circuit line forming device, including an inkjet head to eject a conductive ink onto one side of a substrate, the conductive ink containing nanoparticles including a ferromagnetic core and a conductive layer surrounding the ferromagnetic core; and a magnetic field generator part, positioned on the other side of the substrate in correspondence with the inkjet head, wherein the magnetic field generator part applies a magnetic field on the conductive ink, when the conductive ink is ejected to form circuit lines.

3 Claims, 5 Drawing Sheets

OTHER PUBLICATIONS

Mandal et al. "Magnetite nanoparticles with tunable gold or silver shell", Journal of Colloid and Interface Science 286, (Jun. 2005), 187-194.

U.S. Appl. No. 11/508,312, filed Aug. 23, 2006, In-Keun Shim et al., Samsung Electro-Mechanics Co., Ltd.

Japanese Office Action dated Jul. 14, 2009, issued in corresponding Japanese Application No. 2006-183799.

Korean Office Action dated Sep. 28, 2006, issued in corresponding Korean Application No. 10-2005-0079382.

U.S. Office Action dated Sep. 18, 2009, issued in the file history of U.S. Appl. No. 11/508,312.

U.S. Office Action dated Jan. 28, 2010, issued in the file history of U.S. Appl. No. 11/508,312.

No9tice of Allowance dated Apr. 2, 2010, issued in the file history of U.S. Appl. No. 11/508,312.

* cited by examiner

NANOPARTICLES, CONDUCTIVE INK AND CIRCUIT LINE FORMING DEVICE

CROSS-REFERENCE TO RELATED APPLICATIONS

This application is a divisional and claims priority to U.S. application Ser. No. 11/508,312, filed Aug. 23, 2006, which issued as U.S. Pat. No. 7,771,624, which in turn claims the benefit of Korean Patent Application 10-2005-0079382 filed with the Korean Intellectual Property Office on Aug. 29, 2005, the disclosures of which are incorporated herein by reference in their entirety.

BACKGROUND

1. Field

The present invention relates to nanoparticles, conductive ink containing the nanoparticles, and a circuit line forming device using the conductive ink, and in particular, to nanoparticles, conductive ink, and a circuit line forming device for forming micro circuit lines.

2. Description of the Related Art

A method has recently been proposed of forming micro circuit lines on a substrate by the inkjet technique. This method allows selective forming of micro circuit lines to provide benefits in terms of time and economy. However, with the continued decrease in the size of electronic devices, there is a demand for even more microscopic circuit lines. However, satisfying the size of or the distance between wires required by the trend towards lighter and smaller devices is hindered by the problem of resolution in printing technology. Resolution depends on the diameter of the ink droplets ejected from the inkjet head and the surface tension and interfacial tension of the ink, but there is a limit to decreasing the size of the inkjet head or the diameter of the ejected droplets due to problems such as having to include metal nanoparticles for forming conductive circuit lines.

When ejecting ink by the inkjet technique, the problem of dispersion on the substrate is also an obstacle to forming micro circuit lines. Dispersion may differ according to dynamic properties such as the ejection speed, viscosity, and drying speed of the ink, the weight percentage of metal nanoparticles in the ink, and the surface properties of the substrate.

Also, as the ink droplets thus formed are dried, the metal particles are crowded at the edges due to transmittable flow caused by a difference in drying speeds, to form a coffee stain phenomenon. This causes a conductive or metallic migration phenomenon to consequently affect the reliability of the product.

Therefore, various attempts are being made to form micro patterns while forming wires with superior electrical reliability by the inkjet technique.

SUMMARY

Aspects of the present invention provide ferromagnetic nanoparticles having a core-shell structure. Also, conductive ink containing such ferromagnetic nanoparticles is provided. Aspects of the invention also provide a circuit line forming device which forms micro circuit lines with such ferromagnetic conductive ink using a magnetic field. Also, aspects of the invention provide a circuit line forming device allowing superior electrical reliability by uniformly distributing nanoparticles in the ejected ink to prevent the coffee stain phenomenon and migration.

Additional aspects and advantages of the present invention will be set forth in part in the description which follows and, in part, will be apparent from the description, or may be learned by practice of the invention.

One aspect of the present invention may present a nanoparticle comprising a ferromagnetic core and a conductive layer surrounding the ferromagnetic core.

According to an embodiment, the ferromagnetic core may contain one or more metals selected from a group consisting of iron, cobalt, nickel, and manganese, or an alloy thereof. Also, the conductive layer may contain one or more metals selected from a group consisting of silver, copper, gold, platinum, and aluminum, or an alloy thereof.

Here, the size of the nanoparticle is preferably 5 to 50 nm.

According to another embodiment, the ferromagnetic core may be comprised in 5 to 40 parts by weight, per 100 parts by weight of the nanoparticles.

Another aspect of the present invention may present conductive ink containing the nanoparticles.

Still another aspect of the present invention may present a circuit line forming device, comprising an inkjet head for ejecting the conductive ink onto one side of a substrate, and a magnetic field generator part positioned on the other side of the substrate in correspondence with the inkjet head, where the magnetic field generator part applies a magnetic field on the conductive ink when the conductive ink is ejected to form circuit lines.

According to an embodiment, the magnetic field may be formed in a direction parallel to the direction in which the conductive ink is ejected.

Here, the magnetic field generator part may comprise a magnet, and may also comprise a power source and a coil receiving an electric current from the power source to form a magnetic field.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF THE EMBODIMENTS

Hereinafter, embodiments will be described in detail of the nanoparticle and conductive ink based on the present invention. Also, an explanation will first be given on some of the phenomena that may occur in ink ejected onto a substrate.

Figure 1:
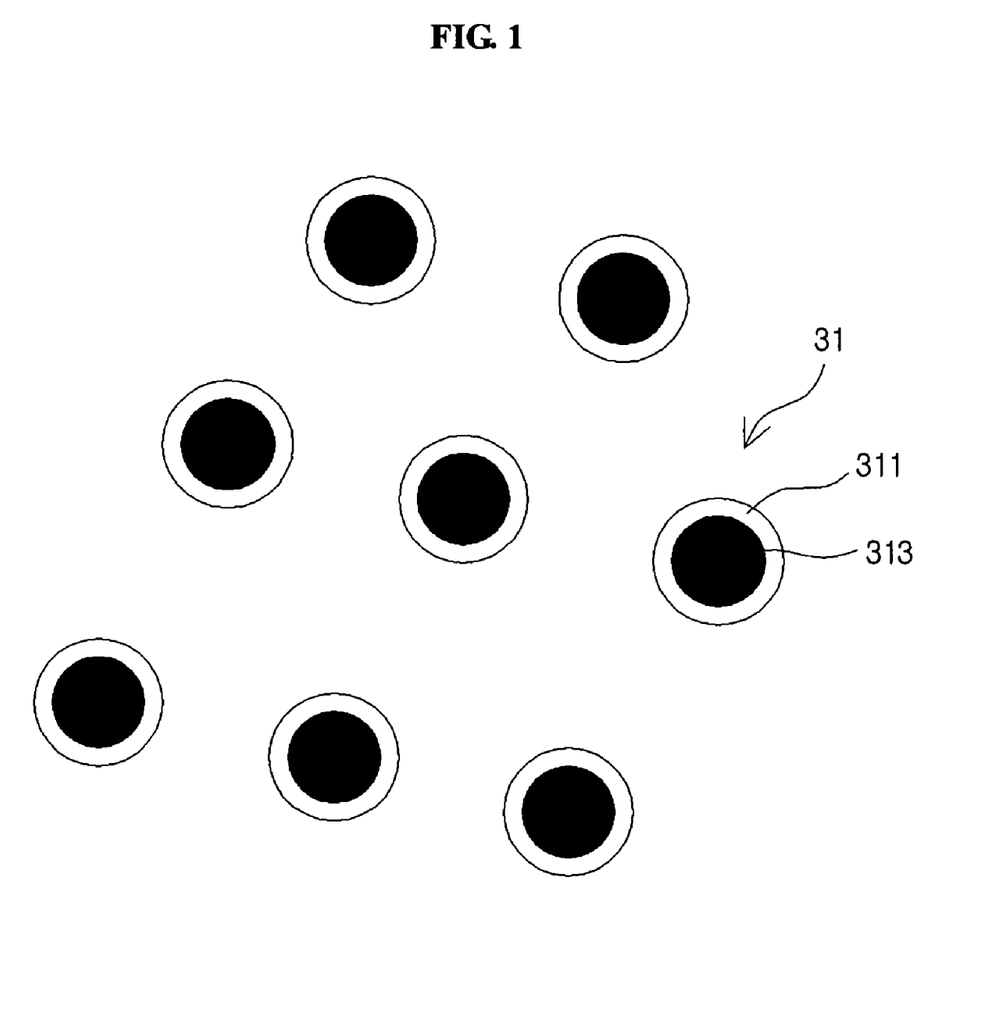
FIG. 1 is an illustration of conductive ink ejected onto a substrate according to prior art.

FIG. 1 is an illustration of conductive ink ejected onto a substrate according to prior art. FIG. 1 shows a cross-sectional view of conductive ink 23 containing nanoparticles 21 ejected through a nozzle onto one side of a substrate 22 and a schematic diagram of an ejected ink droplet. This conductive ink 23 is dried while waiting for the entire circuit line pattern to be printed, or until the succeeding process is performed. Inside the conductive ink 23, however, due to the difference in thicknesses between the edge portion and center portion of the ink droplet, the drying speeds become different. For example, with a droplet formed in the shape of a convex lens, the thin edge portion of the droplet is dried first, and the thick center portion is dried later.

Subsequently, a transmittable flow is formed inside the ink, so that a pinning phenomenon, or a coffee stain phenomenon, occurs, in which the nanoparticles dispersed in the ink move to the edge of the ink droplet. A firing process performed with such ununiform distribution of nanoparticles incurs problems in electrical conductivity, and on a larger scale lowers the electrical reliability of a product.

Also, as the metal particles are crowded at the edges in ink droplets or in a formed unit circuit line, it is easier for migration to occur, which involves the eduction of metals at the negative poles due to the ionization of the metals. This phenomenon of migration is also a factor in lowering the electrical reliability of a product and increasing the defect rate.

Embodiments of the present invention present a circuit line forming device, which uses a magnetic field to prevent such coffee stain phenomenon and migration and allows nanoparticles to be uniformly distributed in the conductive ink. In forming micro circuit lines through the use of a magnetic field, any ink may be used that contains magnetic nanoparticles. Among such magnetic nanoparticles, the nanoparticles having a core-shell structure will be described in detail.

Figure 2:
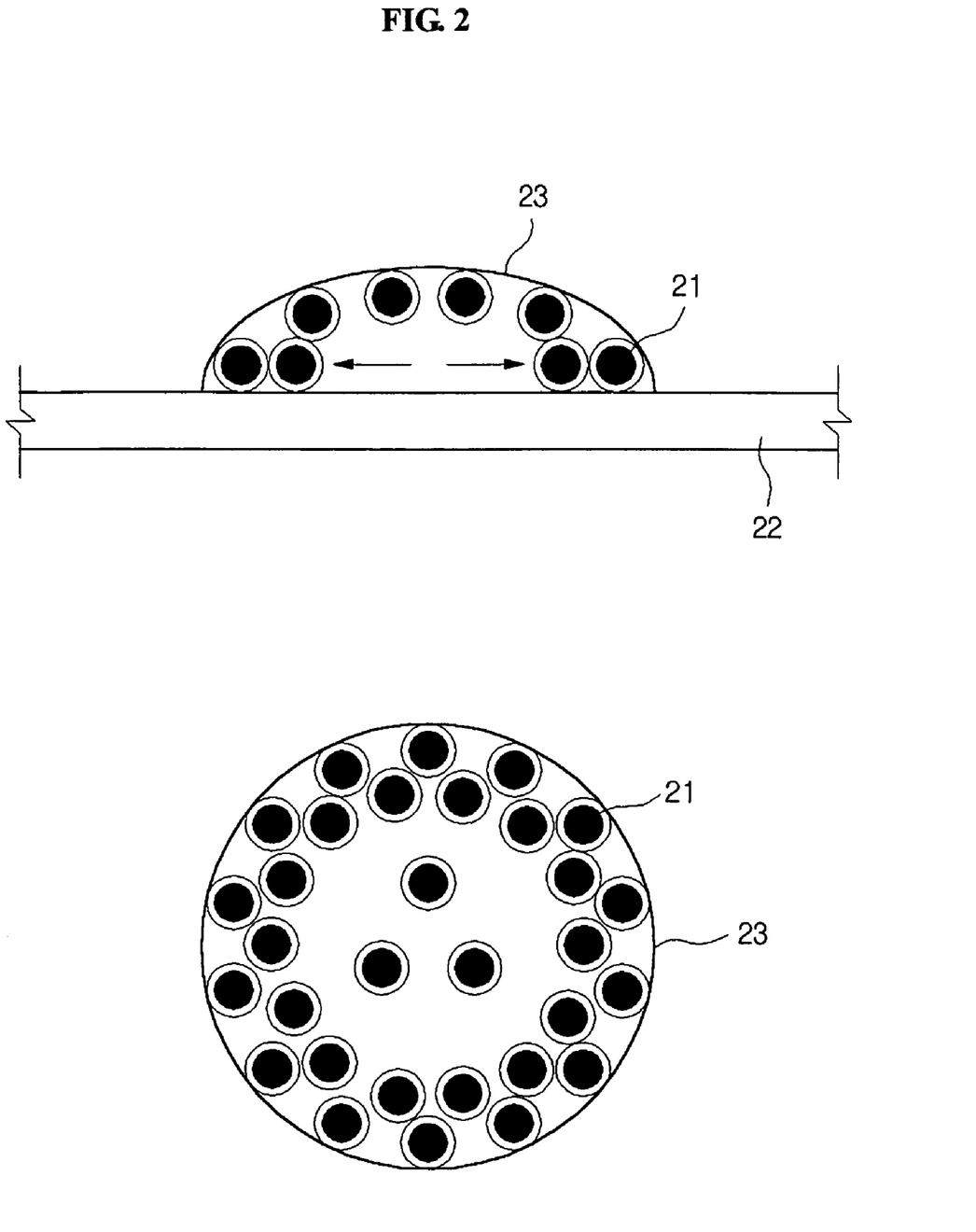
FIG. 2 is a cross-sectional view of nanoparticles according to an embodiment of the present invention.

FIG. 2 is a cross-sectional view of nanoparticles according to an embodiment of the present invention. An embodiment of the invention provides a nanoparticle of a core-shell structure comprising a ferromagnetic core 311 and a conductive layer 313 surrounding this ferromagnetic core. The ferromagnetic core of the nanoparticle is affected by a magnetic field, during the forming of circuit lines, to allow the forming of micro circuit lines and to allow a uniform distribution of nanoparticles in the conductive ink. This ferromagnetic core may contain one or more metals selected from a group consisting of iron, cobalt, nickel, and manganese, or an alloy thereof. Preferably, the ferromagnetic core may be made of iron or an alloy containing iron. This is because these metals display superior magnetism. It may be preferable that the ferromagnetic core is comprised in 5 to 40 parts by weight, per 100 parts by weight of the formed metal nanoparticles. This is because, this weight ratio allows sufficient magnetism to be affected by the magnetic field while at the same time providing highly conductive nanoparticles after the firing, to provide the desired electrical conductivity.

The conductive layers of the nanoparticles based on the present invention undergo necking, due to the firing, to allow the flow of an electric current in the circuit lines. The case of forming circuit lines by producing the conductive ink with nanoparticles made only of ferromagnetic metals such as iron or an alloy thereof would provide high magnetism, but would have a disadvantage in that it is difficult to obtain the desired superior electrical conductance after the firing. Thus, by forming a membrane from a metal having superior conductivity, the nanoparticle may be obtained having both ferromagnetism and high conductivity. Further, it is better in terms of conductivity for the conductive matter to form a shell, as in embodiments of the present invention, than to form the core. Such conductive matter may contain one or more metals selected from a group consisting of silver, copper, gold, platinum, and aluminum, or an alloy thereof. It is desirable for the nanoparticle of the core-shell structure to have a size of 5 to 50 nm, to pass through a nozzle in the form of conductive ink and form micro circuit lines.

The core and conductive layer may be formed using a method of producing nanoparticles that may be readily practiced by those skilled in the art. Examples of methods of producing nanoparticles include vapor phase methods such as inert gas condensation synthesis, chemical vapor condensation synthesis, and sputtering synthesis, etc., and liquid phase methods such as chemical pyrolysis using co-precipitation synthesis, sol-gel synthesis, and micelle synthesis, and hydrothermal synthesis, etc. In addition, there are solid phase methods such as nanopowder synthesis using mechanochemical reactions. While the production methods are not limited to the above, nanoparticles of a core-shell structure based on embodiments of the present invention may be synthesized by sequentially employing a solution method using surfactants and reducing agents.

The nanoparticles having a core-shell structure, based on an embodiment of the present invention, are mixed with a solvent to produce conductive ink having a viscosity of 50 cps, to be suitable for passing through a nozzle. Here, it is important that the nanoparticles be dispersed stably in the solvent, by means of dispersing with a sonicator, etc. The solvent mixed with which the nanoparticles are mixed should preferably be a solvent that can easily be removed by the firing, and an aqueous solution of diethylene glycol butyl ether acetate and ethanol may be used, although the solvent is not thus limited.

The above descriptions related to nanoparticles having a core-shell structure and conductive ink containing the nanoparticles, and hereinafter, embodiments will be described in detail of a circuit line forming device based on the present invention, with reference to the accompanying drawings.

Figure 3:
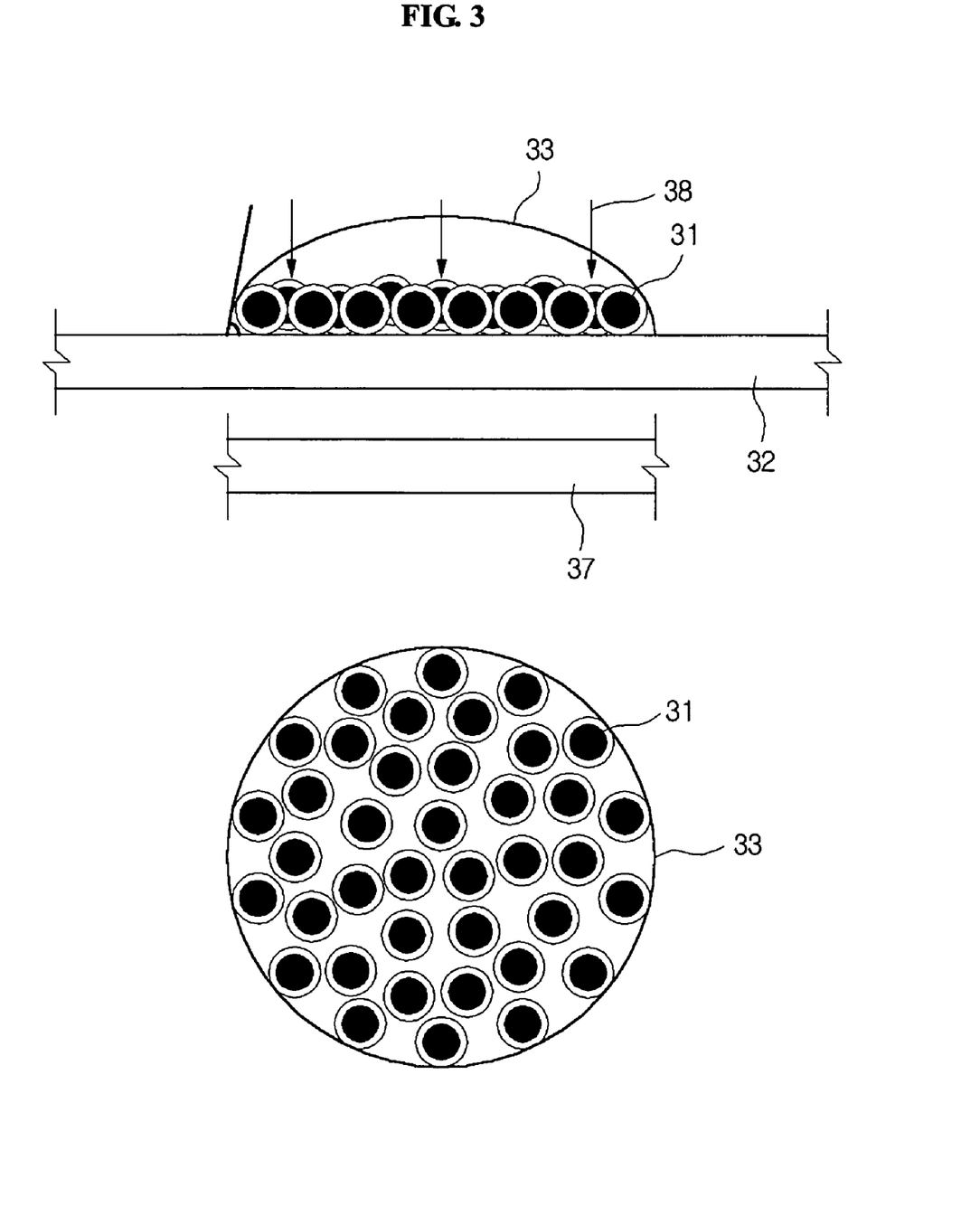
FIG. 3 is an illustration of conductive ink ejected onto a substrate according to an embodiment of the present invention.

FIG. 3 is an illustration of conductive ink ejected onto a substrate according to an embodiment of the present invention. FIG. 3 represents the behavior of nanoparticles inside conductive ink, when the conductive ink 33 containing the nanoparticles 31 having a core-shell structure described above are ejected onto a substrate 32 to form circuit lines, and a magnetic field is applied in the direction of ink ejection. The nanoparticles dispersed in the conductive ink 33 move towards the lower portion of the ink droplet (in the direction of the substrate), and are uniformly arranged in the center and edge of the droplet. Later when the surface of the ink dries, the nanoparticles do not move according to transmittable flow, due to the effect of the magnetic field, so that the coffee stain phenomenon does not occur. It may be preferable for the magnetic field to be applied to the conductive ink until the ink undergoes firing, to obtain circuit lines in which the nanoparticles are uniformly dispersed. Such circuit lines show superior electrical conductivity, and also improve electrical reliability, as there is little concern for the occurrence of migration.

Also, when the conductive ink is ejected from the nozzle, due to the effect of the magnetic field, the tendency of the ink to move straight is enhanced to allow accurate forming of the circuit lines, and the ejection speed is improved to allow a fast wiring process. Moreover, by adjusting the position and magnitude of the magnetic field, the contact angle between the ink droplets and the substrate may be increased when ejecting conductive ink onto the substrate, so that highly microscopic circuit lines may be formed.

Figure 4:
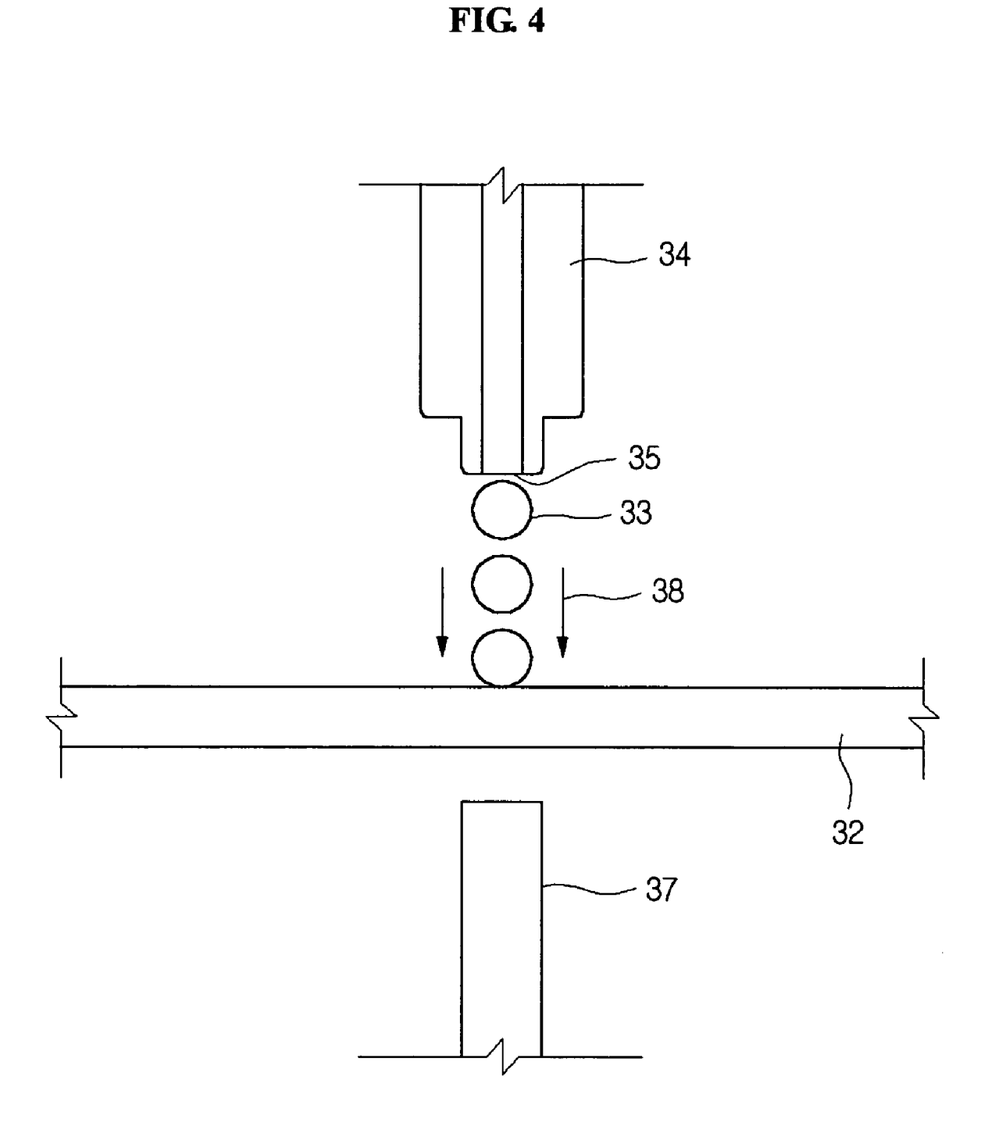
FIG. 4 is a schematic diagram of a circuit line forming device according to an embodiment of the present invention.

FIG. 4 is a schematic diagram of a circuit line forming device according to an embodiment of the present invention. FIG. 4 shows a circuit line forming device, comprising an inkjet head 34, which ejects conductive ink 33 onto one side of a substrate 32, and a magnetic field generator part 37, positioned on the other side of the substrate in correspondence with the inkjet head 34. Here, the magnetic field generator part 37 forms a magnetic field on the upper portion of the substrate so that the magnetic field is applied to the conductive ink 33, when the conductive ink 33 is ejected onto the side of the substrate to form circuit lines. Such a magnetic field generator part 37 may include a magnet having a certain pole.

Figure 5:
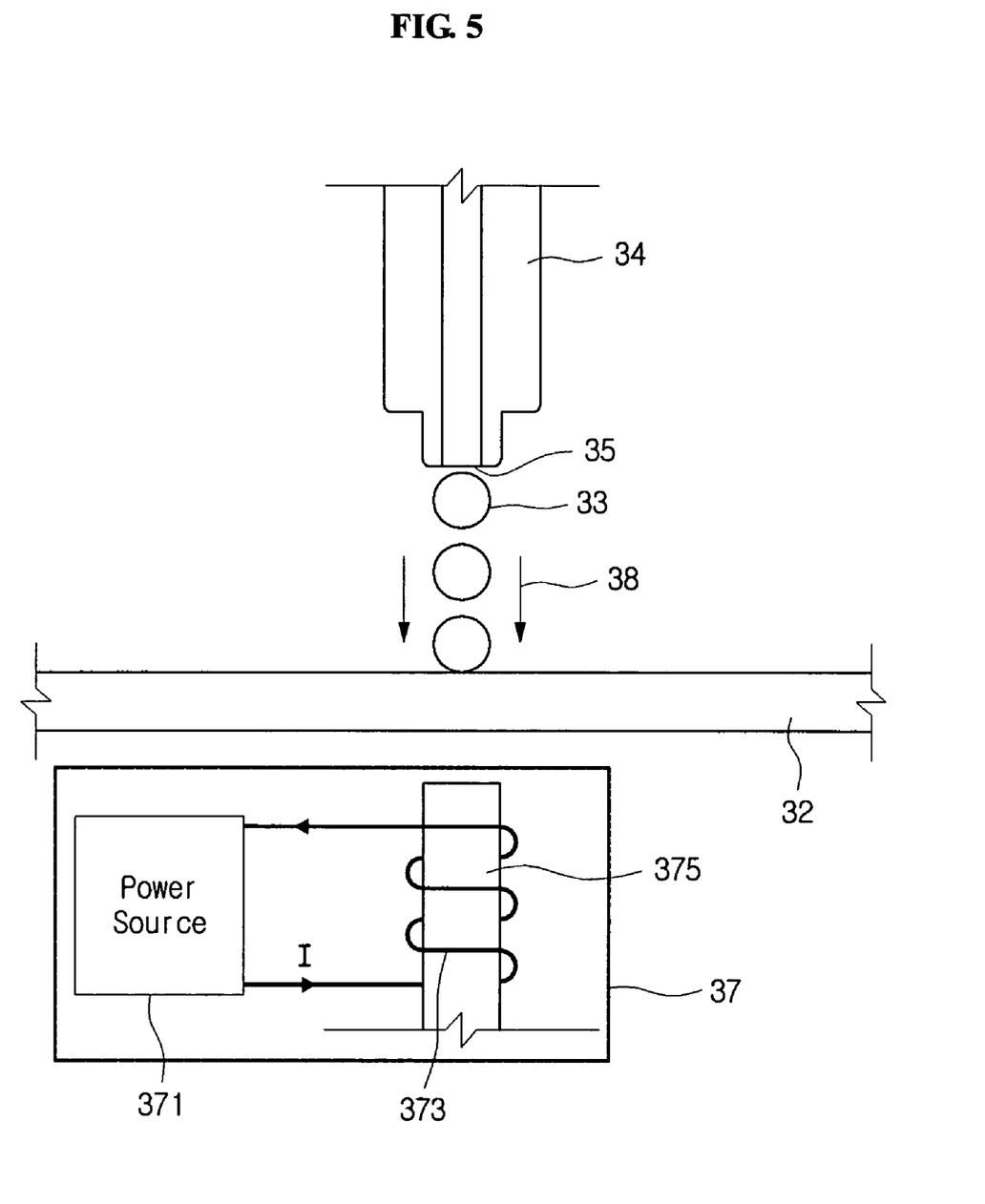
FIG. 5 is a schematic diagram of a circuit line forming device according to another embodiment of the present invention.

FIG. 5 is a schematic diagram of a circuit line forming device according to another embodiment of the present invention. FIG. 5 shows a circuit line forming device, comprising an inkjet head 34, which ejects conductive ink 33 onto one side of a substrate 32, and a magnetic field generator part 37, positioned on the other side of the substrate in correspondence with the inkjet head 34. Here, the magnetic field generator part 37 comprises a power source 371 and a coil 373. The power source 371 supplies an electric current to the coil 373, and the coil 373 receives the electric current from the power source 371 to form a magnetic field 38 on the upper portion of the substrate 32.

In addition, although it may not be illustrated in the present disclosure, any means of forming a magnetic field may be used, which are known by those skilled in the art, as the magnetic field generator part in embodiments of the present invention. It is to be appreciated that elements, though not described in the present disclosure, may be added or omitted in the magnetic field generator part, without departing from the scope of the appended claims.

Here, the magnetic field generator part 37 may be placed to be separated from the substrate by a certain gap, or may be placed in contact with the substrate to form a magnetic field in the space above the substrate. The direction of the magnetic field 38 thus formed may be such that allows the ejected conductive ink to form circuit lines in desired positions on the substrate, and may preferably be formed in a direction parallel to the direction of ink ejection. This enhances the tendency of the ink to move straight and allows easier control of the positions of the circuit lines. Here, the magnitude of the magnetic field 38 depends on factors that affect the magnitude of magnetism provided, such as the magnitude of magnetism of the nanoparticles included in the conductive ink, the percentage of nanoparticles in the conductive ink, the size of the ejected droplets of conductive ink, and ejection speed, etc. The magnitude of the magnetic field may also depend on factors that affect the range of the magnetic field, such as the distance between the substrate and the nozzle, and the distance between the substrate and the magnetic field generator part, etc. Also, the magnetic field 38 may be formed over the area of the substrate, or may be formed opposite the position of the nozzle in correspondence with the movement of the nozzle. Any magnetic field generator part may be used, which satisfies the conditions as set forth above.

The nanoparticle, conductive ink, and conductive circuit lines were explained in the foregoing descriptions, and hereinafter, specific examples relating to these will be described in more detail.

Production of Core-Shell Nanoparticles

Example 1

(1) Synthesis of cores containing Fe: 0.63 g of $FeCl_2$ and 6 g of cetyltrimethylammonium bromide were dissolved in 20 ml of $H_2O$, 10 g of 1-penthanol, and 30 g of hexane. Here, a reducing solution was added of 0.37 g of $NaBH_4$ dissolved in 10 ml of $H_2O$, and the solution was stirred for 2 hours. After the stirring, the synthesized nanoparticles were separated from the solvent using a magnet and cleansed with methanol. The cleansed Fe nanoparticles were dried in a 50° C. vacuum oven.

(2) Synthesis of Fe/Ag nanoparticles: The Fe nanoparticles formed in step (1) were dissolved, together with 0.75 g of $AgNO_3$ and 3 g of cetyltrimethylammonium bromide, in 20 ml of $H_2O$, 20 g of 1-penthanol, and 40 g of hexane. Here, a reducing solution was added of 0.11 g of dissolved $NaBH_4$, and the solution was stirred for 12 hours. After the stirring, the synthesized nanoparticles were separated from the solvent using a magnet and cleansed with methanol. The cleansed Fe nanoparticles were dried in a 50° C. vacuum oven to obtain Fe/Ag nanoparticles of a core-shell structure.

Example 2

(1) Synthesis of cores containing Fe: 4 mmol of Fe alkanoate was dispersed in 50 ml of 1-octadecane, and the temperature of the solution was increased at 5° C. per minute to 310° C., to reflux the solution for 30 minutes. Afterwards, the solution was cooled to normal temperature, and 150 ml of alcohol was added to precipitate Fe nanoparticles. The precipitated Fe nanoparticles were retrieved using a ferromagnet and were cleansed twice or more with a mixed solution of alcohol and acetone before drying. Here, the Fe nanoparticles may also be obtained using a hydrocarbon solvent, such as toluene, xylene, and 1-hexadecane, instead of 1-octadecane.

(2) Synthesis of Fe/Ag nanoparticles: Ag alkanoate was dissolved in 1-octadecane in a mole ratio of 2:1 with respect to the Fe nanoparticles synthesized in step (1), after which pyrolysis, cleansing, and drying were performed on the solution as in step (1) to obtain Fe/Ag nanoparticles of a core-shell structure.

Example 3

(1) Synthesis of cores containing Co: 4 mmol of Co alkanoate was dispersed in 50 ml of 1-octadecane, and the temperature of the solution was increased at 7° C. per minute to 350° C., to reflux the solution for 30 minutes. Afterwards, the solution was cooled to normal temperature, and 150 ml of alcohol was added to precipitate Co nanoparticles. The precipitated Co nanoparticles were retrieved using a centrifugal separator and cleansed were twice or more with a mixed solution of alcohol and acetone before drying. Here, the Co nanoparticles may also be obtained using a hydrocarbon solvent, such as toluene, xylene, and 1-hexadecane, instead of 1-octadecane.

(2) Synthesis of Co/Au nanoparticles: Au alkanoate was dissolved in 1-octadecane in a mole ratio of 2:1 with respect to the Co nanoparticles synthesized in step (1), after which pyrolysis, cleansing, and drying were performed on the solution as in step (1) to obtain Co/Au nanoparticles of a core-shell structure.

Example 4

(1) Production of a Stock Solution: 1.44 g of hydrochloric acid was added to 100 ml of distilled water. 2.535 g of $FeCl_2$ was dissolved in this solution.

(2) Production of Micelle Solution: 565 g of Triton X-100 (Polyoxyethylene(10) isooctylphenyl ether) was added to 250 ml of distilled water, and the solution was sonicated for 15 minutes or more.

(3) Preparation of a Basic Solution: 10 g of NaOH was dissolved in 250 ml of distilled water.

(4) Synthesis of Fe Core Nanoparticles: The micelle solution of step (2) was added to the basic solution of step (3), and the temperature of this solution was increased to a temperature of 70 to 80° C. The stock solution of step (1) was added slowly in droplets to this heated solution, and the solution was reacted for 30 minutes. After the completion of the reaction, the solution was cooled to normal temperature, and centrifugal separation was performed to obtain Fe nanoparticles. The nanoparticles obtained were cleansed three times or more with ethanol and dried in a 50° C. vacuum oven to obtain Fe core nanoparticles.

(5) Synthesis of Nanoparticles: The Fe core particles synthesized in step (4) and $AgNO_3$, in a mole ratio of 2:1, were dissolved in distilled water, and 0.5 g of glucose was added as a reducing agent. After 15 minutes of sonication, the temperature was increased to 80° C., and the solution was reacted for 1 hour. After the completion of the reaction, the solution was cooled to normal temperature, and centrifugal separation was performed to obtain nanoparticles. The nanoparticles obtained were cleansed three times or more with ethanol and dried in a 50° C. vacuum oven to obtain Fe/Ag nanoparticles.

[Production of Conductive Ink]

100 g of 15 to 20 nm nanoparticles having a core-shell structure, produced by Examples 1 to 4, were placed in an aqueous solution of diethylene glycol butyl ether acetate and ethanol, and dispersed with an ultra-sonicator to produce 20 cps of conductive ink. The conductive ink thus produced may be printed on a circuit substrate by the inkjet technique to form conductive circuit lines.

As described in the disclosure set forth above, conductive ink containing ferromagnetic nanoparticles having a core-shell structure and a circuit line forming device applying a magnetic field, according to embodiments of the present invention, allow uniform distribution of nanoparticles in the ejected ink, and provide circuit lines with superior electrical reliability by preventing the coffee stain phenomenon and migration. Also, a circuit line forming device according to embodiments of the present invention allows accurate forming of the circuit lines by enhancing the tendency of the ink to move straight, and allows a fast wiring process by improving the ejection speed. Moreover, by adjusting the position and magnitude of the magnetic field, the contact angle between the ink droplets and the substrate may be increased when ejecting conductive ink onto the substrate, so that highly microscopic circuit lines may be formed.

Although a few embodiments of the present invention have been shown and described, it will be appreciated by those skilled in the art that changes may be made in these embodiments without departing from the principles and spirit of the present invention, the scope of which is defined in the appended claims and their equivalents.

What is claimed is:

1. A circuit line forming device, comprising:
    an inkjet head to eject a conductive ink onto one side of a substrate, the conductive ink containing nanoparticles comprising a ferromagnetic core and a conductive layer surrounding the ferromagnetic core; and
    a magnetic field generator part, positioned on the other side of the substrate in correspondence with the inkjet head, wherein the magnetic field generator part comprises a power source and a coil receiving an electric current from the power source to form a magnetic field and applies a magnetic field on the conductive ink, when the conductive ink is ejected to form circuit lines.

2. The circuit line forming device of claim 1, wherein the magnetic field is formed in a direction parallel to the direction in which the conductive ink is ejected.

3. The circuit line forming device of claim 1, wherein the magnetic field generator part comprises a magnet.

* * * * *